United States Patent [19]
Hall et al.

[11] Patent Number: 5,519,888
[45] Date of Patent: May 21, 1996

[54] RECEIVER INCORPORATING AN OTHER USERS NOISE SIMULATOR (OUNS) FOR USE IN A COMMUNICATION SYSTEM

[75] Inventors: Scott M. Hall; Clarke J. Calvin, both of Fort Worth, Tex.

[73] Assignee: Motorola, Inc., Schaumburg, Ill.

[21] Appl. No.: 268,481

[22] Filed: Jun. 30, 1994

[51] Int. Cl.⁶ .................................................. H04B 1/06
[52] U.S. Cl. ........................... 455/249.1; 455/226.1; 455/233.1; 455/234.2; 455/246.1; 375/345
[58] Field of Search ............................ 455/234.4, 232.1, 455/233.1, 240.1, 249.1, 250.1, 246.1, 247.1, 239.1, 234.2, 67.4, 226.1, 296, 226.3, 226.4; 375/345; 330/149, 129

[56] References Cited

U.S. PATENT DOCUMENTS

| | | | |
|---|---|---|---|
| 4,479,254 | 10/1984 | Craiglow | 455/247.1 |
| 4,600,890 | 7/1986 | Horvat | 455/250.1 |
| 5,103,431 | 4/1992 | Freeman et al. | 367/135 |

*Primary Examiner*—Reinhard J. Eisenzopf
*Assistant Examiner*—Doris To
*Attorney, Agent, or Firm*—Raymond J. Warren

[57] ABSTRACT

A received signal is provided to an automatic gain controller which normalizes the received signal to a known voltage level. The automatic gain controller is also provided with an OUNS noise signal through a voltage controlled attenuator. The voltage controlled attenuator (VCA) is controlled by an OUNS controller such that the output of the VCA represents the desired other user noise level to be combined with the received signal in the automatic gain controller.

13 Claims, 6 Drawing Sheets

RECEIVER INCORPORATING AN OTHER USERS NOISE SIMULATOR (OUNS) FOR USE IN A COMMUNICATION SYSTEM

FIELD OF THE INVENTION

The present invention relates, in general, to communication systems and, more particularly, to an Other User Noise Simulator (OUNS) for use in a communication system.

BACKGROUND OF THE INVENTION

Currently, in evaluating communication systems, particularly wireless communication systems such as a Code Division Multiple Access (CDMA) system, it is necessary to simulate the noise that would be present if the system were loaded to various capacities. One manner to provide this simulation would be to put the desired number of subscriber units into the system. However, this would make the testing difficult to control and require a large area in which the subscriber units would be dispersed. The preferable way to accomplish this simulation, is to provide an OUNS device in the receiving stage of a transceiver.

A prior art method of accomplishing this is to inject noise from an OUNS device into the receiver prior to an Automatic Gain Control (AGC) stage. This prior art method measures the actual RF input level. The OUNS controller then uses this RF input level to determine the noise to be injected. To determine the RF input level, an additional receiver branch with AGC is used to provide feedback to the OUNS controller.

A problem with the current design is that the AGC devices are not accurate enough in the expected range of input RF input levels. In addition, it requires the addition of another receiver branch with AGC. This adds to the cost, complexity, and size of the receiver.

DETAILED DESCRIPTION OF THE DRAWINGS

Figure 1:
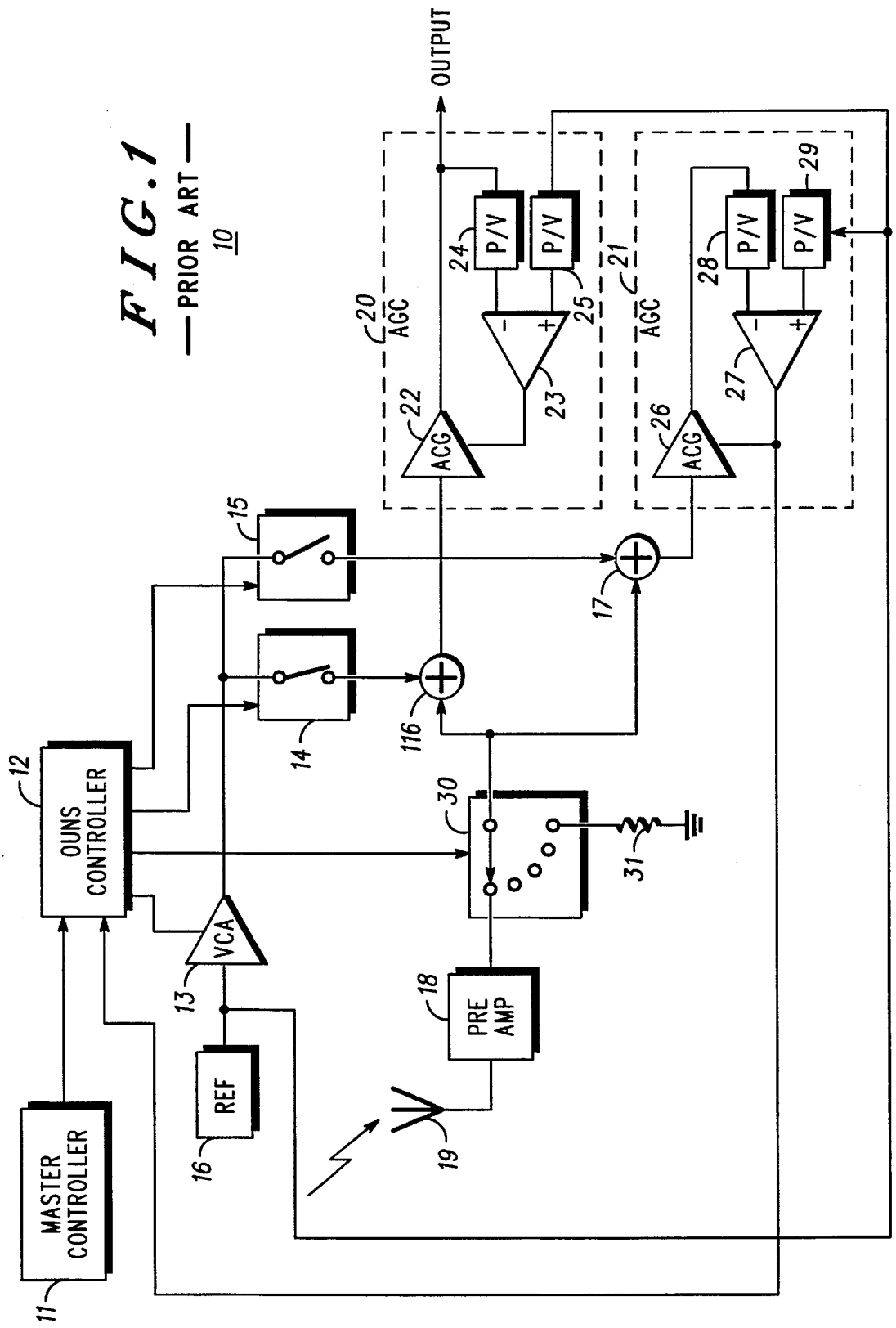
FIG. 1 a block diagram of a prior art receiver incorporating an OUNS device.

Referring initially to FIG. 1, a block diagram of a prior art receiver, generally designated 10, incorporating an OUNS device is illustrated. Receiver 10 consists of a master controller 11 which controls an OUNS controller 12. Master controller 11 may be located at a central operation and maintenance center (OMC) or may be located at the particular receiver station. The OUNS controller 12 may also be located at the OMC or the particular receiver station. Controllers 11 and 12 may also both be a part of the same physical device.

The OUNS controller 12 has control outputs coupled to a voltage controlled attenuator (VCA) 13 and to a pair of switches 14 and 15. The functionality of the voltage controlled attenuator can be implemented with a fixed attenuator and a voltage controlled gain stage. The VCA can actually be a digital controlled attenuator where no one voltage is used to control the attenuator.

A reference signal generator 16 is coupled to an input of VCA 13. Reference signal generator 16 is used to provide a 0 dB (deciBle) signal to VCA 13. The absolute dVm power is not important, it typically ranges from −10 dBm to 10 dBm. The output of VCA 13 is coupled to an input of switches 14 and 15. The output of switches 14 and 15 are coupled to one input of combiners 116 and 17, respectively. The other inputs of combiners 116 and 17 are coupled to a preamplifier 18 which receives an input RF energy through an antenna 19. For normal operation, switch 14 is closed and switch 15 is open.

The output from combiners 116 and 17 are input to automatic gain controllers (AGC) 20 and 21, respectively. A second input of AGC 20 is coupled to the output of reference 16 and the output of AGC 20 is the output of device 10. A second input of AGC 21 is coupled to the output of reference 16 and the output of AGC 21 is coupled to OUNS controller 12.

AGC 20 is comprised of an voltage controlled gain (VCG) device 22 which receives the input of AGC 20. The output of ACG 22 is provided as the output of AGC 20 and as the input to a first power-to-voltage converter 24. The input to AGC 20 from reference 16 is provided to a second power-to-voltage converter 25. The converted voltage outputs from converters 24 and 25 are provided to the inputs of a operational amplifier 23. Operational amplifier 23 generates a signal representative of the voltage difference of its input signals and provides an output used to control ACG 22.

AGC 21, is comprised of an voltage controlled gain (ACG) device 26 which receives the input of AGC 21. The output of ACG 26 is provided to the input of a third power-to-voltage converter 28. The output of converter 28 is provided to a first input of an operational amplifier 27. The other input of operational amplifier is provided from a fourth power-to-voltage converter 29 which receives an input from reference generator 16. The output of amplifier 27 is used to control ACG 26 and as a feedback signal to OUNS controller 12.

AGC circuit 21 is manually calibrated to the OUNS VCA 13 and reference 16 by closing switch 15 and opening switch 14. The inputs to combiners 116 and 17 are also disconnected from preamplifier 18, by switch 30, and connected to ground through a 50 ohm resistor 31. The OUNS control can now map attenuator setting to AGC voltage reading from the output of operational amplifier 27. In operation, OWNS controller 12 will inject noise at an intermediate frequency (IF) of 70 MHz (MegaHertz) at a power of approximately −30 dBm. The noise from controller 12 is a Gaussian noise generated by a noisy diode. It should be noted here that since the receiver is considered a linear receiver, the operation will be described relative to the receivers input.

Device 10 operates by measuring the RF input level at the input of the receiver. This is accomplished by AGC 21. With the RF input level known, OUNS controller 12 will inject an amount of noise power with a mean and sigma power according to the number of users the OUNS is set up to simulate.

In one example, with the OUNS set to simulate 50% of the loading, the OUNS would inject the exactly same amount of noise as received by the RF input level for a combined signal of 2×. In a second example, with the OUNS set to simulate 75% of the loading, the OUNS would inject three times the amount of noise as received by the RF input level for a combined signal of 4×.

Figure 2:
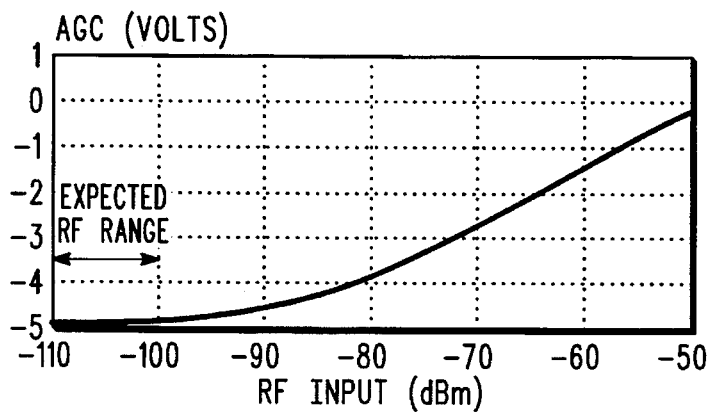
FIGS. 2 and 3 are graphs illustrating the operation of the receiver of FIG. 1.
Figure 3:
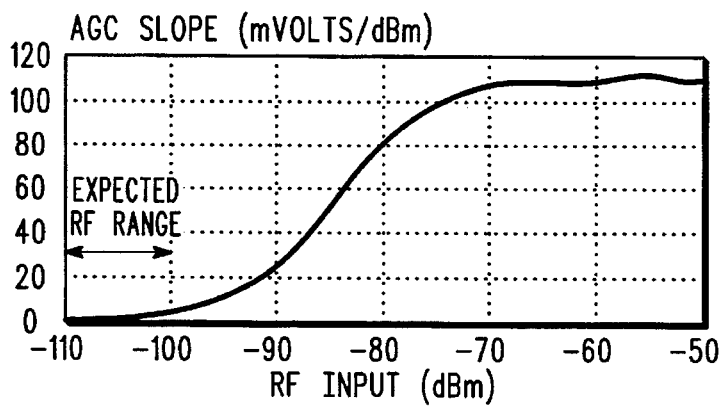

This type of design has two drawbacks. First, using an AGC voltage to measure an RF input level is inaccurate in the expected range of inputs. In FIGS. 2 and 3, graphs illustrating the operation of receiver 10 are shown. In FIG. 2, the AGC is represented in volts. In FIG. 3, the slope of the AGC voltage is represented by millivolts per dBm. In both cases, the graphs show that, in the area of interest, −110 to −100 dBm, there is very little measurable movement in the AGC voltage. This results in a device which is very insensitive in the expected RF range. The actual measurements show that the AGC voltage change in the range indicated is less than 20 millivolts. This is small when compared with the background noise inherent on the AGC which is greater than 10 millivolts.

Another problem with the design of FIG. 1 is the need for extra AGC circuits to measure the received power. In receiver 10, one extra circuit, AGC 21, was required. In a diversity receiver, having multiple input paths, this would require two extra AGC circuits, one in each port. This adds to the expense and complexity of such a circuit.

Figure 4:
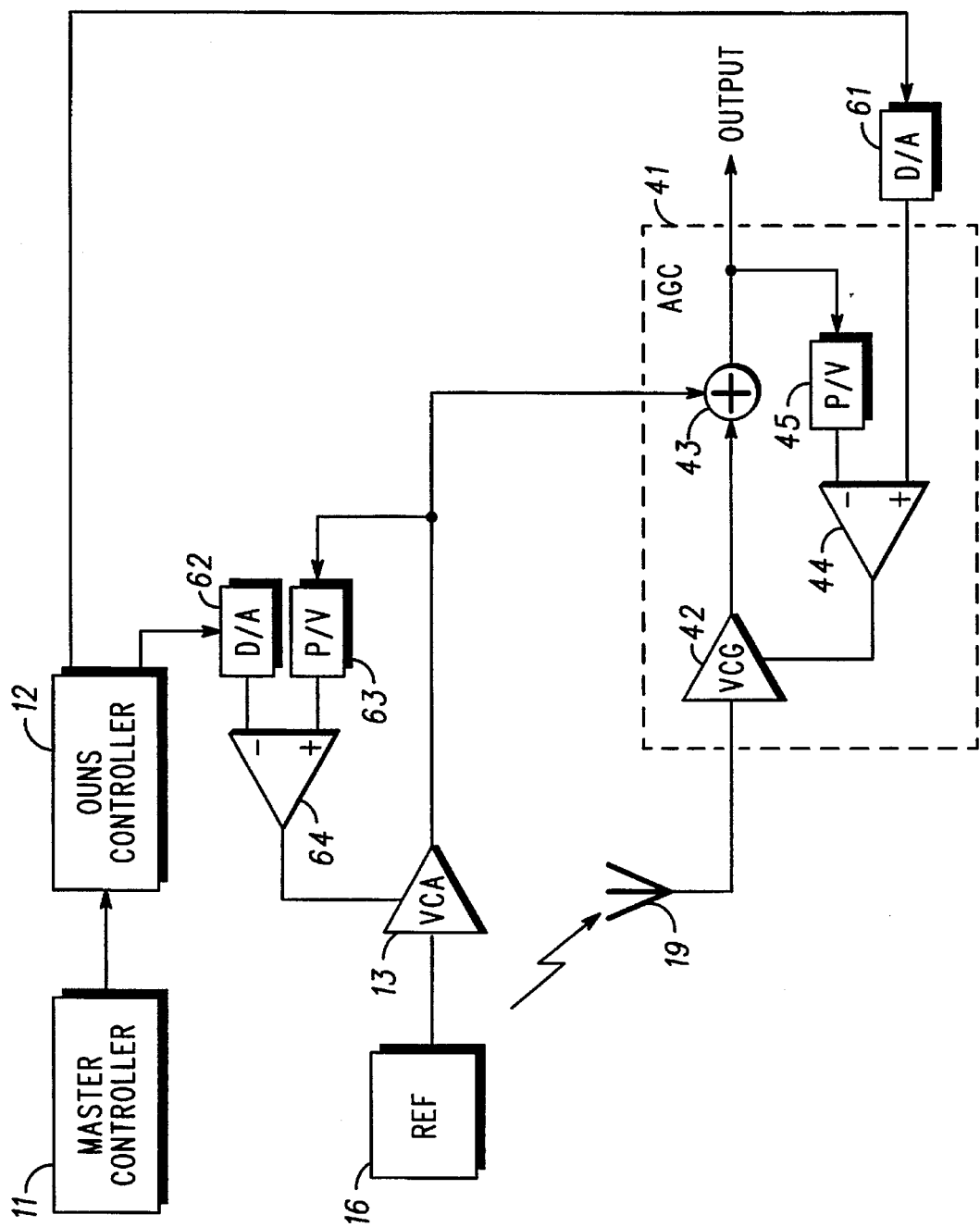
FIG. 4 is a block diagram of a receiver embodying the present invention.

Referring now to FIG. 4, a block diagram of a receiver, generally designated 40, embodying the present invention is illustrated. Please note that similar devices are represented by similar reference numbers. Receiver 40 still has master controller 11, OUNS controller 12, reference 16, and voltage controlled attenuator 13. VCA 13 receives a control signal from an operational amplifier 64. Amplifier 64 receives one input from OUNS controller 12 through a D/A 62 and the second input from the output of VCA 13 through power-to-voltage converter 63.

Receiver 40 also contains an AGC 41. AGC 41 consists of a voltage controlled gain (VCG) device 42 coupled to receive an input from antenna 19. The output of VCG 42 is coupled to a first input of a mixer 43. A second input of mixer 43 is coupled to the output of VCA 13. The output of mixer 43 provides the output for AGC 41 as well as one input to an operation amplifier (Op Amp) 44 through a power-to-voltage converter 45. A second input to Op Amp 44 is provided from OUNS controller 12 through a digital-to-analog (D/A) converter 61.

As illustrated, this design places the OUNS after the AGC's variable gain stage to eliminate the need for a separate AGC circuit for the OUNS to measure the RF signal input level. This circuit may also use either Gaussian or non-Gaussian noise for the OUNS noise source. The advantage of a non-Gaussian noise source is that it is easier to generate and control the bandwidth.

The above circuit may be placed in several places within the receiver. It will operate at the RF stages, the intermediate frequency (IF) stages, or the baseband stages. This may also operate with analog or digital circuits after an analog-to-digital (A/D) converter.

In operation AGC 41 will normalize the RF input signal to a known voltage (or power) level to feed an analog-to-digital (A/D) converter. The OUNS operates by occupying the correct amount of capacity as controlled by OUNS controller 12. For example, if a 50% OUNS loading is desired, the OUNS would contribute −3 dB (½ power) to the demodulator. AGC 41 would adjust all power received at the input to contribute −3 dB to the demodulator. If 75% loading were to be represented, −1.25 dB (¾ power) would be supplied to the demodulator. AGC 41 would adjust all power received at the input to contribute −6 dB (¼ power) to the demodulator.

Figure 5:
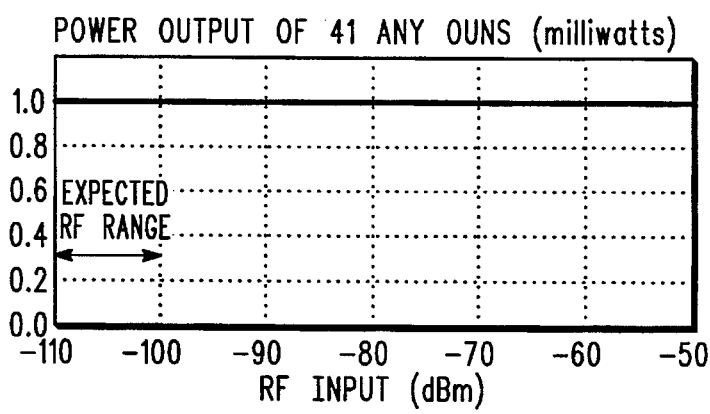
FIGS. 5 and 6 are graphs illustrating the operation of the receiver of FIG. 4.
Figure 6:
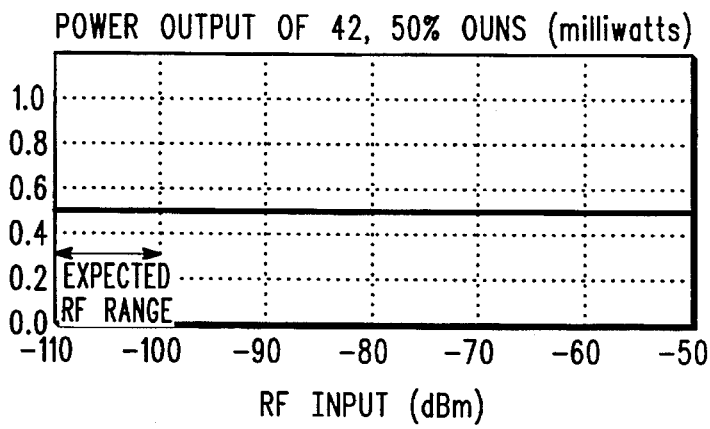

In FIGS. 5 and 6, graphs illustrating the operation of receiver 40 are illustrated. In FIGS. 5 and 6, the output is represented in milliwatts. In a comparison of these graphs to the graphs in FIGS. 2 and 3, it can be seen that, in the area of interest, −110 to −100 dBm, there is a much flatter response. These also illustrate the emphasis of the invention away from the AGC voltages toward AGC output power.

Figure 7:
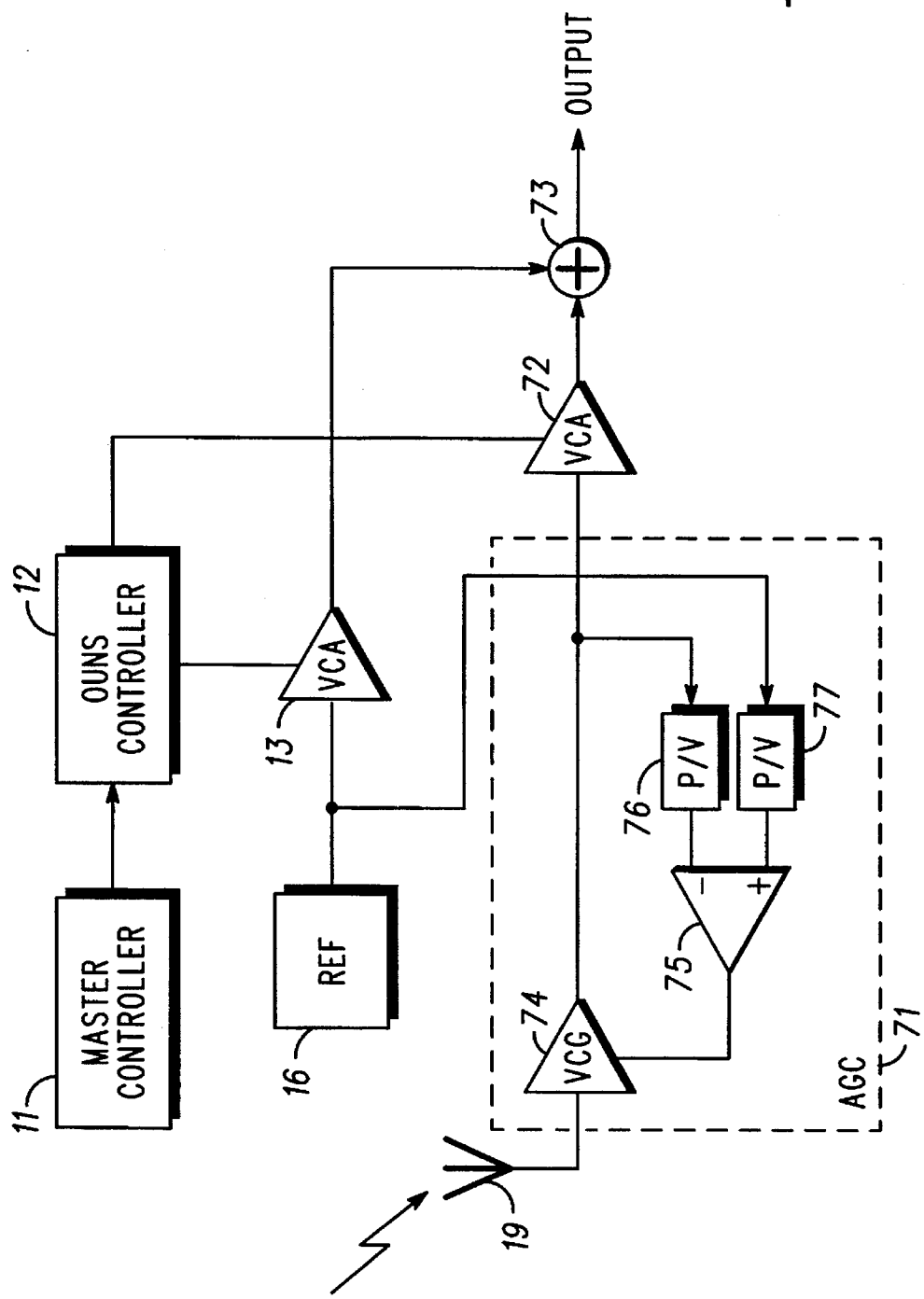
FIG. 7 is a block diagram of a second receiver embodying the present invention.

Referring now to FIG. 7, a second receiver, generally designated 70, embodying the present invention is illustrated. Receiver 70 also contains master controller 11, OUNS controller 12, reference 16, and a first VCA 13. Receiver 70 has an AGC 71 which is coupled to receive the RF energy from antenna 19. The other input of AGC 71 is coupled to reference 16. The output of AGC 71 is coupled to a second VCA 72. Both attenuators 13 and 72 are controlled by OUNS controller 12. The output of both attenuators is combined in mixer 73 to provide the modified received signal.

AGC 71 is comprised of a VCG 74 which is coupled to receive the input from antenna 19. The output of VGC 74 is coupled to provide the output from AGC 71 and is also input to an op amp 75 through a power-to-voltage converter 76. It should be understood here that in place of VGC 74, a voltage controlled attenuator (VCA) or a digital controlled gain or attenuation may be used.

The second input to op amp 75 is provided from the reference input to AGC 71 through a power-to-voltage converter 77.

Figure 8:
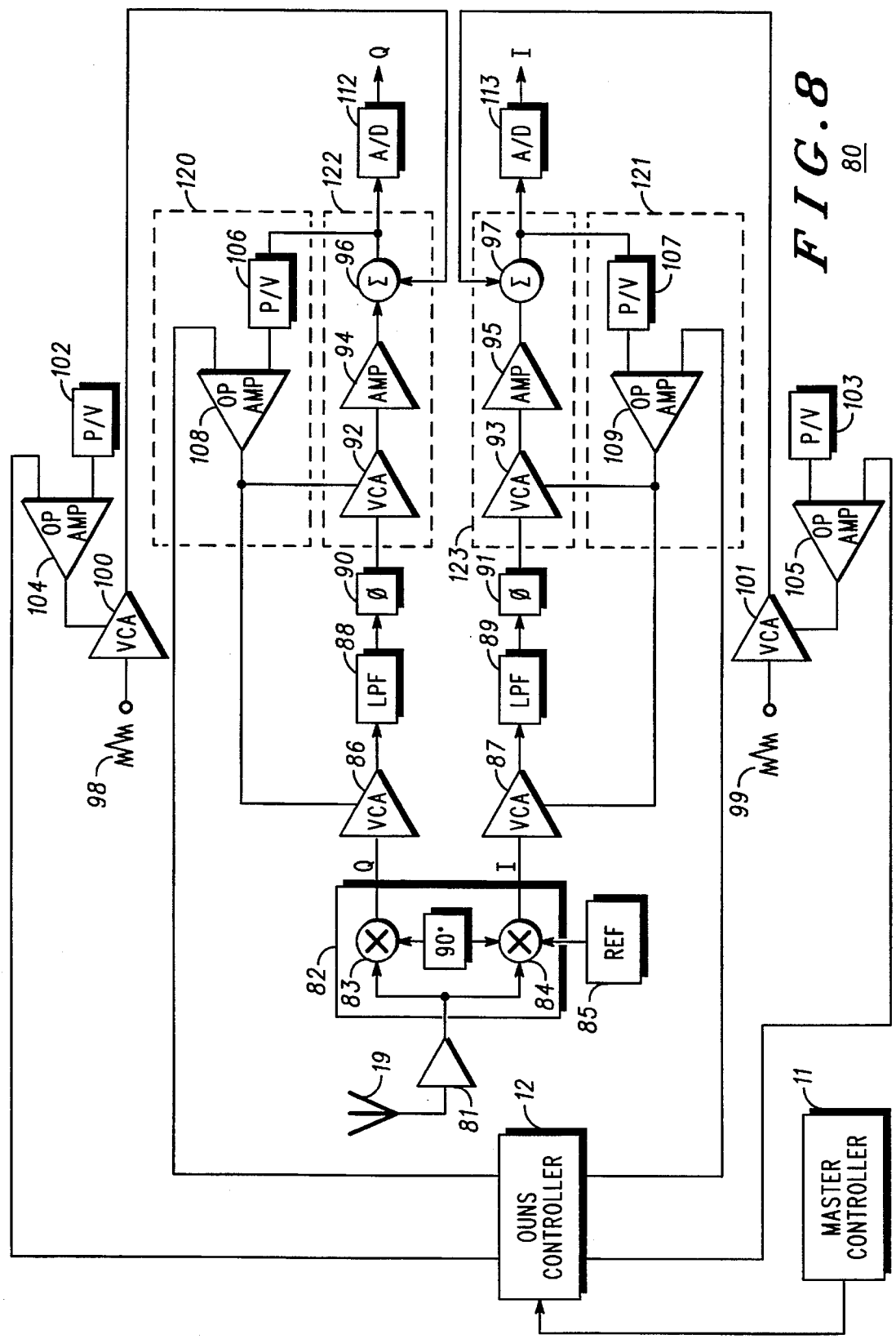
FIG. 8 is a block diagram of a third receiver embodying the present invention.

Referring now to FIG. 8, a third receiver, generally designated 80, embodying the present invention in greater detail is illustrated. The signal received at antenna 19 is first converted to an intermediate frequency by any of the methods well known in the art. The signal is then amplified in amplifier 81 before being divided into its I and Q components in quadrature demodulator 82. Quadrature demodulator 82 consists of a pair of mixers, 83 and 84, which are fed by signals in quadrature from the reference 85. The processing of both portions of the signal, while independent, are the same from this point. The Q leg of the processing will be described in detail here with the understanding that the I leg has the same processing steps.

The Q signal is first provided to a VCA 86 where it is attenuated. The output is then filtered through a low pass filter (LPF) 88 and phase corrected in phase equalizer 90. The output of phase equalizer 90 is then provided to a voltage controlled amplifier 92 for further amplification and then amplified in amplifier 94.

The output of amplifier 94 is then provided to one input of a summer 96. A second input of summer 96 is generated using an OUNS noise generator 98. The output of noise generator 98 is coupled to a VCA 100. The output from VCA 100 is provided as the second input to summer 96. The output of VCA 100 is also transmitted to one input of an integrator 104 through a power-to-voltage converter 102. The other input of integrator 104 is coupled to OUNS controller 12 and the output is coupled to a control input of VCA 100. It should be noted here that in this embodiment OUNS controller 12 provides a voltage reference as opposed to the power reference previously provided.

The output of summer 96 is coupled to one input of an op amp integrator 108 through a power-to-voltage converter 106. The other input to op amp integrator 108 is provided by master controller 11. The output of op amp integrator 108 is coupled to a control input of VCA 92 and to a gain sequencer 110. The output of gain sequencer 110 is coupled to the control input of VCA 86.

Finally, the output of summer 96 is also provided to an analog-to-digital (A/D) converter which provides the signal output. The combination of VCA 92, amplifier 94, and summer 96 forms a VCG 122 as indicated by the dashed line. The combination of VCG 122 with op amp integrator 108 and power-to-voltage converter 106 forms an AGC 120.

Again, OUNS control 12 operates by occupying the correct amount of capacity as controlled by OUNS controller 12. If a 50% OUNS loading is desired, the OUNS would contribute −3 dB (½ power) to the demodulator. VCAs 86 and 92 would adjust the power received at the input to contribute −3 dB to the demodulator. If 75% loading were to be represented, −1.25 dB (¾ power) would be supplied to the demodulator. VCAs 86 and 92 would adjust all power received at the input to contribute −6 dB (¼ power) to the demodulator.

Figure 9:
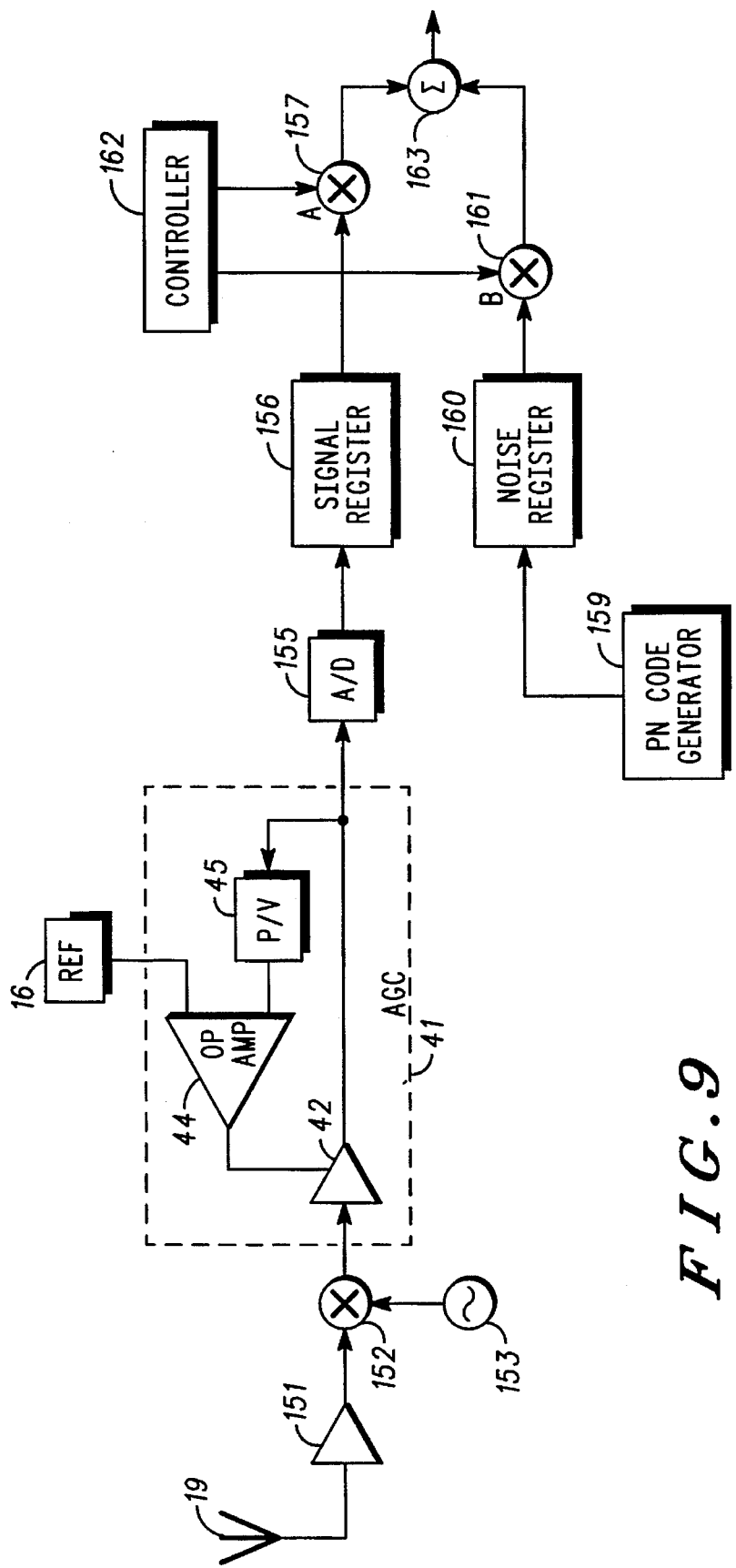
FIG. 9 is a block diagram of a fourth receiver embodying the present invention.

Referring now to FIG. 9, a fourth embodiment, generally designated 150, of the present invention illustrates a digital implementation. A signal is again received by antenna 19 and is amplified in preamplifier 151. The amplified signal is then mixed with a local oscillator 153 in a mixer 152. The output of mixer 152 is processed through AGC 41 as in previous embodiments. The output of AGC 41 is converted to a digital signal in analog-to-digital (A/D) converter 155. The digital signal is then stored in signal register 156 before being forwarded to multiplier 157. A pseudo noise generator 159 provides a second digital signal which is stored in noise register 160 before being provided to a multiplier 161. The second inputs to multipliers 157 and 161 is provided by controller 162. The control input (A) to multiplier 157 is defined by equation (1) below:

$$A = \sqrt{\text{LOAD}} \quad (1)$$

where $$\text{LOAD} = \%\text{OUNS}/100\% \quad (2)$$

The control input (B) to multiplier 161 is defined by equation (3) below:

$$B = 1 - \sqrt{\text{LOAD}} . \quad (3)$$

The outputs from multipliers 157 and 161 are then summed in adder 163 which provides the output from OUNS 150.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A receiver capable of simulating other user noise for use in a communication system, said receiver comprising:

first automatic gain control means for controlling a gain of a received signal, said first automatic gain control means having a first input coupled to receive an output from an antenna means and an output;

first voltage controlled attenuator means for attenuating a signal passing therethrough, said first voltage controlled attenuator means having an output coupled to a second input of said first automatic gain control means;

first reference means for providing a first reference signal, said first reference means having an output coupled to an input of said first voltage controlled attenuator means; and control means for setting a simulated other user noise level, said control means having an output coupled to a control input of said first voltage controlled attenuator means and a control input of said first automatic gain control means.

2. The receiver of claim 1 wherein said first automatic gain control means comprises:

voltage controlled gain means for providing gain to a signal passing therethrough, said voltage controlled gain means having an input coupled to said first input of said first automatic gain control means;

combining means for combining a plurality of signals, said combining means having a first input coupled to an output of said voltage controlled gain means and a second input coupled to said second input of said first automatic gain control means;

operational amplifier means for comparing two input signals, said operational amplifier means having an output coupled to a control input of said voltage controlled gain means and a first input coupled to said control input of said first automatic gain control means; and power-to-voltage converting means for converting a power level of a signal output from said combining means to a voltage signal, said power-to-voltage converting means having an input coupled to an output of said combining means and an output coupled to a second input of said operational amplifier means.

3. The receiver of claim 1 further comprising master control means for controlling said control means, said master control means having an output coupled to an input of said control means.

4. The receiver of claim 1 wherein said first automatic gain control means comprises:

second voltage controlled attenuator means for providing attenuation to a signal passing therethrough, said second voltage controlled attenuator means having an input coupled to said first input of said first automatic gain control means;

combining means for combining a plurality of signals, said combining means having a first input coupled to an output of said second voltage controlled attenuator means and a second input coupled to said second input of said first automatic gain control means;

operational amplifier means for comparing two input signals, said operational amplifier means having an output coupled to a control input of said second voltage controlled attenuator means and a first input coupled to said control input of said first automatic gain control means; and power-to-voltage converting means for converting a power level of a signal output from said combining means to a voltage signal, said power-to-voltage converting means having an input coupled to an output of said combining means and an output coupled to a second input of said operational amplifier means.

5. The receiver of claim 1 further comprising:

second voltage controlled attenuator means for attenuating a signal passing therethrough, said second voltage controlled attenuator having an input coupled to said antenna means and a control input coupled to said control means;

filter means for filtering a signal passing therethrough, said filter means having an input coupled to an output of said second voltage controlled attenuator means; and phase equalizing means for equalizing a phase of a signal passing therethrough, said phase equalizing means having an input coupled to an output of said filter means and an output coupled to said first automatic gain control means.

6. The receiver of claim 1 further comprising:

quadrature demodulating means for separating said desired RF signal into an in-phase signal and a quadrature-phase signal, said quadrature demodulator means having an input coupled to said antenna means and a first output coupled to said first automatic gain control means;

second automatic gain control means for controlling a gain of one of said in-phase signal and said quadrature-phase signal, said second automatic gain control means having an input coupled to a second output of said quadrature demodulating means and an output;

second voltage controlled attenuator means for attenuating a signal passing therethrough, said second voltage controlled attenuator means having an output coupled to a second input of said second automatic gain control means; and second reference means for providing a second reference signal, said second reference means having an output coupled to an input of said second voltage controlled attenuator means.

7. A receiver for use in a communication system, said receiver comprising:

antenna means for receiving RF energy including a desired RF signal;

automatic gain control means for controlling a gain of the received RF energy, said automatic gain control means having a first input coupled to receive an output from said antenna means;

first voltage controlled attenuator means for attenuating a signal passing therethrough, said first voltage controlled attenuator having an input coupled to an output of said automatic gain control means;

combining means for combining a plurality of signals, said combining means having a first input coupled to an output of said first voltage controlled attenuator means and an output;

second voltage controlled attenuator means for attenuating a signal passing therethrough, said second voltage controlled attenuator having an output coupled to a second input of said combining means;

reference means for providing a reference signal, said reference means having an output coupled to an input of said second voltage controlled attenuator means and further coupled to an input of said automatic gain control means; and control means for setting a simulated noise level, said control means having a first output coupled to a control input of said first voltage controlled attenuator means and a second output coupled to a control input of said second voltage controlled attenuator means.

8. The receiver of claim 7 wherein said automatic gain control means comprises:

voltage controlled gain means for providing gain to a signal passing therethrough, said voltage controlled gain means having an input coupled to said first input of said automatic gain control means;

operational amplifier means for comparing two input signals, said operational amplifier means having an output coupled to a control input of said voltage controlled gain means;

first power-to-voltage converting means for converting a power level of a signal from said voltage controlled gain means to a voltage signal, said first power-to-voltage converting means having an input coupled to an output of said voltage controlled gain means and an output coupled to a first input of said operational amplifier means; and second power-to-voltage converting means for converting a power level of a signal from said reference means to a voltage signal, said second power-to-voltage converting means having an input coupled to an output of said reference means and an output coupled to a second input of said operational amplifier means.

9. The receiver of claim 7 further comprising a master control means for controlling said control means, said master control means having an output coupled to an input of said control means.

10. A receiver capable of simulating other user noise for use in a communication system, said receiver comprising:

antenna means for receiving Radio Frequency, RF, energy including a desired RF signal;

automatic gain control means for controlling a gain of the received RF energy, said automatic gain control means having a first input coupled to receive an output from said antenna means, an output, and a control input;

analog-to-digital converting means for converting an analog signal to a digital signal, said analog-to-digital converting means having an input coupled to said output of said automatic gain control means and an output;

first register means for storing a portion of a digital signal, said first register means having an input coupled to said output of said analog-to-digital converter;

noise generating means for providing a noise signal, said noise generating means having an output;

second register means for storing a portion of a noise signal, said second register means having an input coupled to said output of said noise generating means;

first mixing means for mixing a plurality of signals, said first mixing means having a first input coupled to an output of said first register means, a second input, and an output;

second mixing means for mixing a plurality of signals, said second mixing means having a first input coupled to an output of said second register means, a second input, and an output;

summing means for combining a plurality of signals, said summing means having a first input coupled to said output of said first mixing means, a second input coupled to said output of said second mixing means, and an output; and control means for providing a control signal to said first and second mixing means, said control means having a first control output coupled to said second input of said first mixing means and a second control output coupled to said second input of said second mixing means.

11. The receiver of claim 10 wherein said automatic gain control means comprises:

voltage controlled gain means for providing gain to a signal passing therethrough, said voltage controlled gain means having an input coupled to said first input of said automatic gain control means and an output coupled to said output of said automatic gain control means;

operational amplifier means for comparing two input signals, said operational amplifier means having an output coupled to a control input of said voltage controlled gain means and a first input coupled to a control input of said automatic gain control means; and power-to-voltage converting means for converting a power level of a signal output from said automatic gain control means to a voltage signal, said power-to-voltage converting means having an input coupled to an output of said voltage controlled gain means and an output coupled to a second input of said operational amplifier means.

12. A receiver capable of simulating other user noise for use in a communication system, said receiver comprising:

an antenna having an output;

a voltage controlled gain having an input coupled to said output of said antenna, a control input, and an output;

a first operational amplifier having a first input, a second input, and an output coupled to said control input of said voltage controlled gain;

a summer having a first input coupled to said output of said voltage controlled gain, a second input, and an output;

a first power-to-voltage converter having an input coupled to said output of said summer and an output coupled to said first input of said first operational amplifier;

a first digital-to-analog converter having an input and an output coupled to said second input of said first operational amplifier;

a voltage controlled attenuator having an input, and output coupled to said second input of said summer, and a control input; and a controller having a first output coupled to said input of said first converter and a second output coupled to said control input of said voltage controlled attenuator.

13. The receiver of claim 12 further comprising:

a second operational amplifier having an output coupled to said control input of said voltage controlled attenuator;

a second power-to-voltage converter having an input coupled to an output of said voltage controlled attenuator and an output coupled to a first input of said second operational amplifier; and a second digital-to-analog converter having an input coupled to a second output of said controller and an output coupled to a second input of said second operational amplifier.

* * * * *

UNITED STATES PATENT AND TRADEMARK OFFICE
CERTIFICATE OF CORRECTION

PATENT NO. : 5,519,888
DATED : May 21, 1996
INVENTOR(S) : Hall, et al.

It is certified that error appears in the above-indentified patent and that said Letters Patent is hereby corrected as shown below:

Column 10, Line 9 reads "first converter" should be --first digital-to-analog converter--.

Signed and Sealed this

Twenty-seventh Day of August, 1996

BRUCE LEHMAN

Attest:

Attesting Officer

Commissioner of Patents and Trademarks